(12) United States Patent
Han

(10) Patent No.: US 7,339,792 B2
(45) Date of Patent: Mar. 4, 2008

(54) GRAPHICS CARD APPARATUS WITH IMPROVED HEAT DISSIPATING ASSEMBLIES

(75) Inventor: Tai-Sheng (Andrew) Han, Fullerton, CA (US)

(73) Assignee: EVGA Corporation, Brea, CA (US)

( * ) Notice: Subject to any disclaimer, the term of this patent is extended or adjusted under 35 U.S.C. 154(b) by 97 days.

(21) Appl. No.: 11/304,169

(22) Filed: Dec. 14, 2005

(65) Prior Publication Data

US 2007/0133178 A1 Jun. 14, 2007

(51) Int. Cl.
*H05K 7/20* (2006.01)

(52) U.S. Cl. ............... 361/719; 361/695; 361/698; 361/700; 165/80.3; 165/80.4; 165/80.5; 165/104.33

(58) Field of Classification Search ........ 361/687–695, 361/697–702, 704–712, 727, 717–719, 724; 165/80.3, 80.4, 104.32–104.34, 121–126; 174/15.1, 15.2, 16.3, 252; 257/707–727; 62/259.2

See application file for complete search history.

(56) References Cited

U.S. PATENT DOCUMENTS

| | | | |
|---|---|---|---|
| 6,029,742 A * | 2/2000 | Burward-Hoy | 165/80.4 |
| 6,452,797 B1 * | 9/2002 | Konstad | 361/695 |
| 6,587,343 B2 * | 7/2003 | Novotny et al. | 361/698 |
| 6,671,177 B1 | 12/2003 | Han | |
| 2006/0164808 A1 * | 7/2006 | Stefanoski | 361/700 |

\* cited by examiner

*Primary Examiner*—Michael Datskovskiy
(74) *Attorney, Agent, or Firm*—Buchanan, Ingersoll & Rooney, LLP

(57) ABSTRACT

A cooling mechanism to dissipate thermal energy generated by the active electronic components of a graphics card assembly. A mechanism includes a radiator and a metal block that is thermally coupled to the active electronic components and that has a tubing therewithin. The radiator includes a pipe and baffles attached to the pipe, where one end of the pipe is connected to one end of the tubing. A pump, connected to the other ends of the tubing and pipe, circulates coolant through the pipe and tubing to transfer thermal energy from the metal block to the radiator. The mechanism also includes a fan unit to generate and direct an air flow toward the radiator and metal block, where the air flow removes the thermal energy from the radiator and metal block.

18 Claims, 5 Drawing Sheets

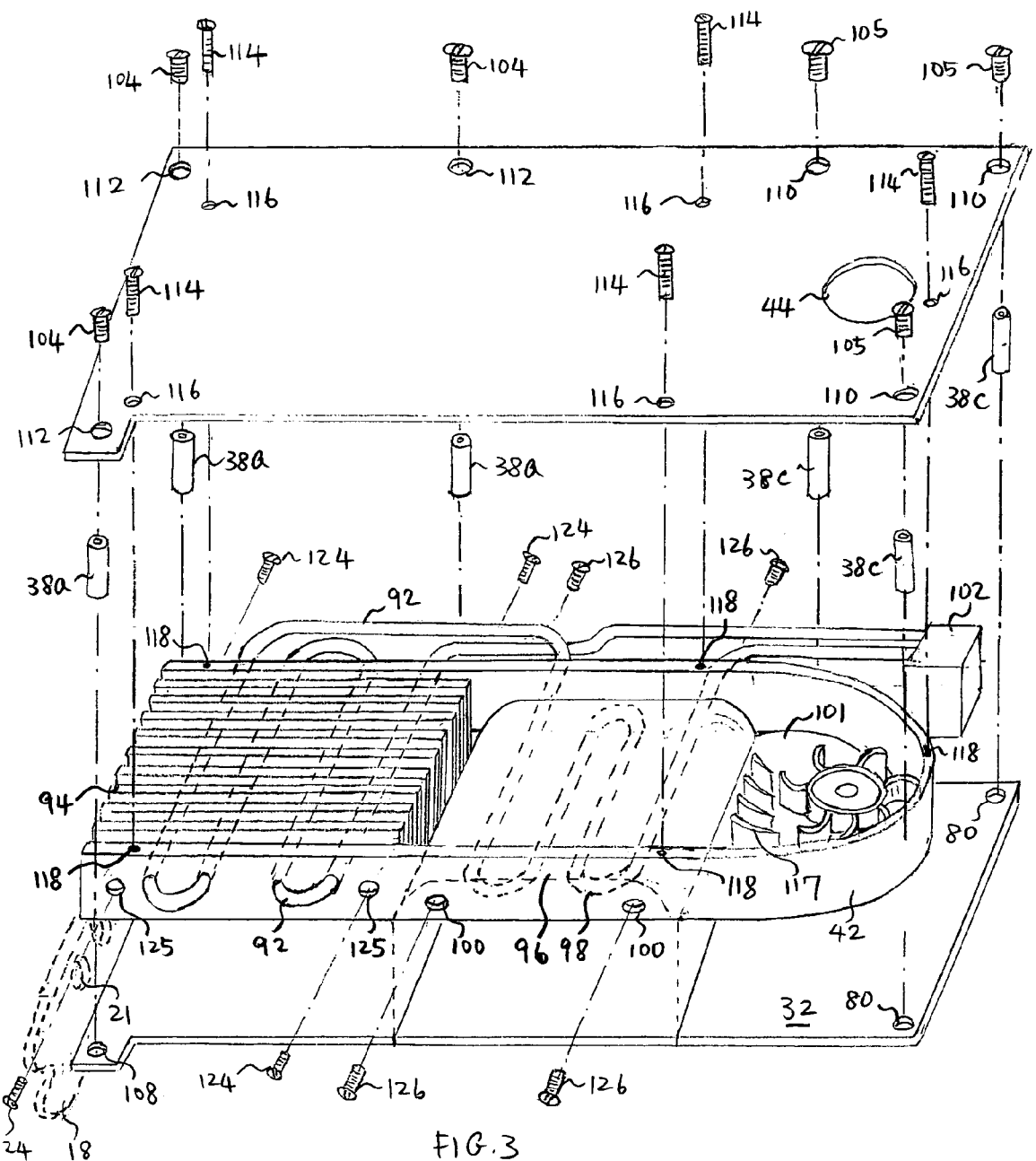
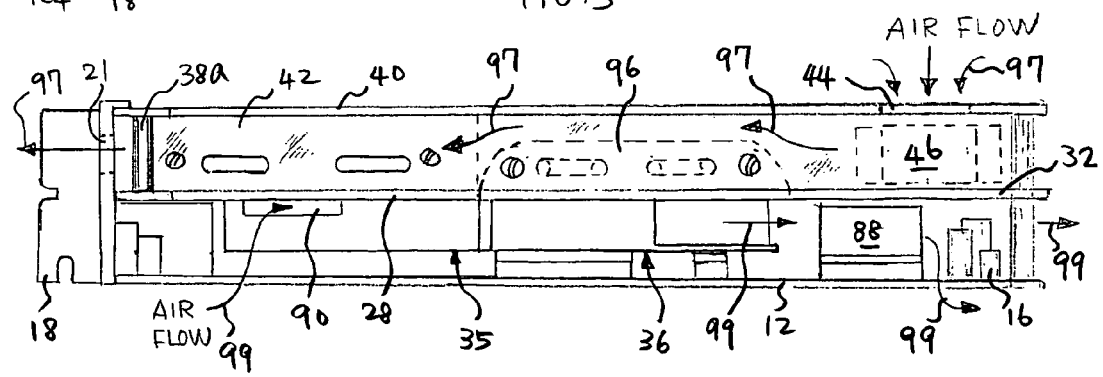
FIG. 3
FIG. 4

GRAPHICS CARD APPARATUS WITH IMPROVED HEAT DISSIPATING ASSEMBLIES

BACKGROUND OF THE INVENTION

The present invention generally relates to graphics card apparatus and, more particularly, to an improved graphics card assembly having a cosmetic cover plate and two heat dissipating subassemblies.

In order to enable desktop and other computers to rapidly process graphics and game technology, add-on units generally referred to as "graphics cards" or "VGA" cards" are often installed in computer devices. Such cards include a separate processor, called a GPU, one or more memory chips, and other required circuitry, all mounted to a circuit board including an edge connector that is adapted to plug into an available slot in the associated computer device.

Such cards often have extremely large computing power and, as a consequence, generate substantial heat that if not dissipated will adversely affect operation of the graphics card. Heretofore, various approaches have been tried to dissipate or otherwise remove heat from the thermal energy generating components and normally include some type of fan for blowing air across the active components, and perhaps some type of thermal mass capable of sinking the heat generated. To date, however, the efficiency of such devices has not been optimal. Besides, the thermal energy generated by the GPU and memory chips for more sophisticated graphics and games, such as 3-D graphics, may approach the maximum capacity of the existing heat dissipation mechanisms. Thus, there is a need for an improved heat extraction or dissipation mechanism, which can be added to a standard graphics card to efficiently remove thermal energy generated thereby.

SUMMARY OF THE INVENTION

The present invention provides a graphics card assembly that has two heat dissipating mechanisms to dissipate thermal energy generated by active electronic components, such as GPU and memory. The first mechanism includes a fan and a heat sink that is thermally coupled to the electronic components and that has one or more radiators, where the thermal energy transferred to the heat sink is dissipated by air flow generated by the fan. The second mechanism includes a metal block that has a tubing therewithin and a radiator that has baffles and a pipe. The metal block is thermally coupled to the heat sink of the first mechanism and receives any thermal energy that is not dissipated by the first mechanism and thus remaining in the heat sink. A pump, connected to the pipe and tubing, circulates coolant therethrough so that the thermal energy conducted to the metal block is sunk to the baffles of the radiator. The second mechanism also includes a fan unit that generates and directs an air flow toward the metal block and radiator to remove heat therefrom.

In one aspect of the present invention, a graphics card apparatus with improved heat dissipation includes a radiator and a metal block that is thermally coupled to one or more active electronic components of the apparatus and that has a tubing therewithin. The radiator has a pipe and baffles thermally coupled to the pipe, where the inlet end of the pipe is connected to the exit end of the tubing. A pump, connected to the inlet end of the tubing and the exit end of the pipe, circulates coolant through the pipe and tubing to transfer thermal energy from the metal block to the radiator. The apparatus also includes a fan carrier for carrying a fan and vanes, where the air flow generated by the fan is directed toward the radiator baffles and metal block by the vanes. A flow director is positioned beneath the cover plate of the apparatus and surrounds the radiator, metal block and fan to form an air flow passage from the fan to the metal block and thence to the radiator. Thermal energy generated by the electronic components is transferred to the metal block and thence to the radiator via the coolant and is ultimately removed from the radiator and metal block by an air flow drawn into the air passage.

In another aspect of the present invention, a graphics card assembly includes a printed circuit board with heat generating components affixed thereto and a heat dissipating mechanism attached to the printed circuit board. The heat dissipating mechanism includes a radiator and a metal block that is thermally coupled to the heat generating components and that has a tubing therewithin. The radiator has a pipe and baffles thermally coupled to the pipe, where the inlet end of the pipe is connected to the exit end of the tubing. A pump, connected to the inlet end of the tubing and the exit end of the pipe, circulates coolant through the pipe and tubing to transfer thermal energy from the metal block to the radiator. The mechanism also includes a fan carrier for carrying a fan and vanes, where the air flow generated by the fan is directed toward the radiator baffles and metal block by the vanes. A flow director is positioned beneath the cover plate of the assembly and surrounds the radiator, metal block and fan to form an air flow passage from the fan to the metal block and thence to the radiator. Thermal energy generated by the components is transferred to the metal block and thence to the radiator via the coolant and is ultimately removed from the metal block and the radiator by an air flow drawn into the air passage.

These and other features, aspects and advantages of the present invention will become better understood with reference to the following drawings, description and claims.

BRIEF DESCRIPTION OF THE DRAWINGS

FIG. 3 is an exploded perspective view showing the several components of the upper heat dissipating subassembly included in the graphics card assembly illustrated in FIG. 1;

FIG. 4 is a side elevation taken along the direction 4-4 of FIG. 1;

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Figure 1:
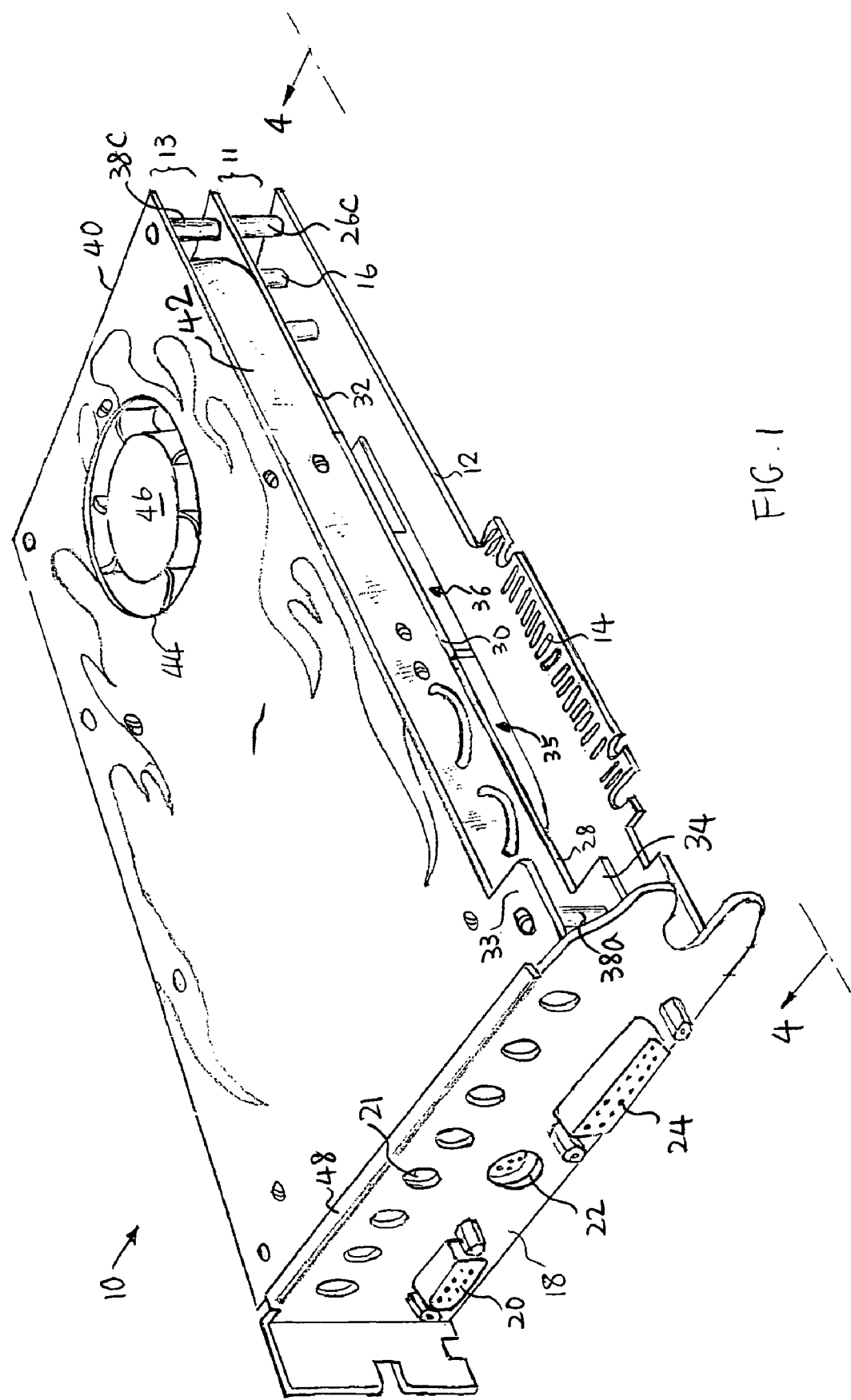
FIG. 1 is a perspective view showing a presently preferred embodiment of a graphics card assembly including an upper and a lower heat dissipating subassembly in accordance with the present invention.

Referring to FIG. 1 of the drawing, a graphics card assembly in accordance with the present invention is illustrated at 10 and includes a lower heat dissipating subassembly 11 and an upper heat dissipating subassembly 13. As illustrated, the assembly also includes a printed circuit board 12 having edge connectors 14 and populated with numerous electronic components some of which are shown at 16. The board is attached at the near end to an end plate 18 carrying various cabling connectors 20, 22 and 24 used to communicate signals into and out of the assembly. The end plate 18 also has perforations or holes 21 forming the outlet of air flow generated by an upper fan unit 46, as will be explained later. Affixed to the printed circuit board 12 by means of vertically extending spacing legs or risers, one of which is shown at 26c, are planar, generally rectangular middle insulating plates 28 and 32. The cover plate 40 has a circular aperture 44 and is secured to the insulating plate 28 and 32 by means of risers, two of which are shown at 38a and 38c. The cover plate 40 may be made of a heat conducting material, while the insulating plates 28 and 32 may be made of Teflon or any suitable heat insulating plastic. The foremost extremities of the cover plate 40 and middle insulating plate 28 respectively include laterally extending tabs 33 and 34 conforming to a similar tab on the board 12.

The front edge of the cover plate 40 is captured beneath a turned back lip 48 forming a side of the cover plate 40. Disposed between the plate 40 and middle insulating plates 28 and 30 is the upper heat dissipating subassembly 13 including an upper heat sink or radiator, a metal block and a flow director 42, which will be elucidated below. Positioned within the aperture 44 is an upper fan unit 46 for generating air flow that removes thermal energy from the upper radiator and metal block. Note that the cover plate 40 is flat and ideally suited for decorative graphics, manufacturer's or marketer's trademarks, etc. Disposed beneath the middle insulating plate 28 and carried thereby is a lower fan carrier 35. A lower heat sink 36 is affixed to the board 12 by means of vertically extending risers (not shown in FIG. 1).

In use, the graphics card assembly is oriented so as to have the near right edge of the assembly, as depicted, facing a slot on a computer motherboard and mounted thereto by slipping the edge connectors 14 into the slot so that the assembly communicates with devices on the motherboard via the edge connector 14. As described in more detail below, most of the thermal energy generated by the electronic components of the assembly is sunk to the lower heat sink 36 and upper radiator (not shown in FIG. 1), wherein the lower heat sink 36 and upper radiator are respectively cooled by the air flows created by the upper fan unit 46 and the lower fan unit carried by the fan carrier 35.

Figure 2:
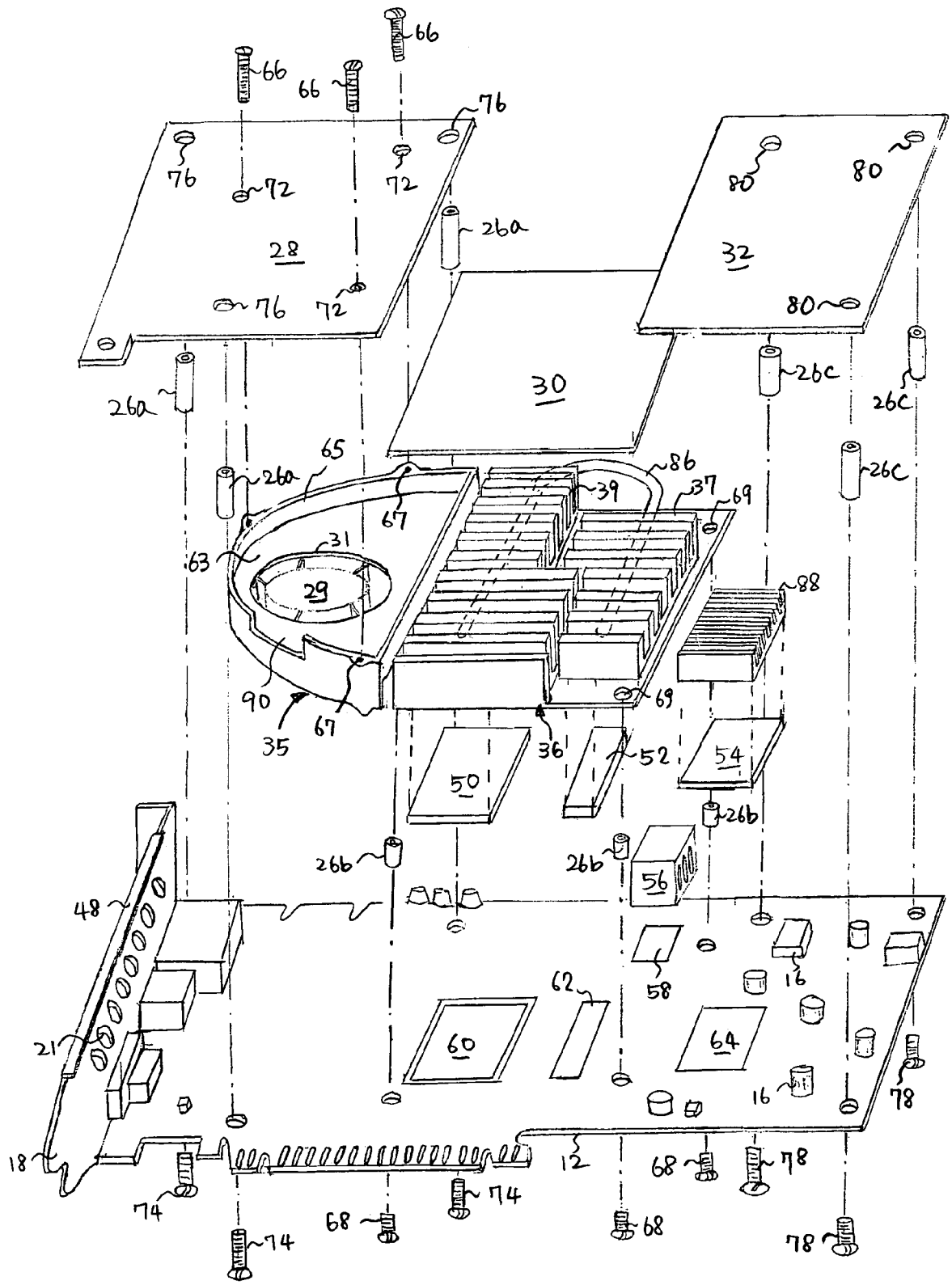
FIG. 2 is an exploded perspective view showing the several components of the lower heat dissipating subassembly and middle plates included in the graphics card assembly illustrated in FIG. 1.

In FIG. 2, the lower heat dissipating subassembly, middle plates 28, 30 and 32, and risers 26a-26c are shown exploded away from the populated graphics card 12. The lower heat dissipating subassembly 11 (FIG. 1) includes: a lower fan unit 29; a fan carrier 35 for carrying a fan unit 29 and vanes (not shown in FIG. 2); the lower heat sink 36 that includes a Zalman tube 86 and heat sinks or radiators 37 and 39; additional heat sink ribs or radiator 88; and thermal transfer block 56. The lower heat dissipating subassembly 11 also includes copper plates 50, 52 and 54 that are shown below the lower heat sink 36 and radiator 88. The plates 50, 52 and 54 may be formed of any suitable material that has good heat conducting characteristics. These copper plates 50, 52 and 54 engage the top surfaces of and transfer heat from GPU, memory and power IC that are not shown but will be positioned at 60, 62 and 64 on the board 12. Each of the copper plates 50, 52 and 54 may be soldered or brazed to, or molded into the bottom of the lower heat sink 36 or radiator 88. The thermal transfer block 56 engages the top surface of a heat generating, active electronic component that is not shown but will be positioned at 58, and transfer heat to the middle thermal transfer plate 30.

The fan carrier 35 includes a top plate 63 and a side barrier 65, and encloses the lower fan unit 29. The top plate 63 and side barrier 65 respectively have a circular aperture or hole 31 and an air intake slot 90 through which the lower fan unit 29 draws air. The lower heat sink 36 includes a generally flat bottom plate and radiators 37 and 39 formed on the bottom plate, wherein the bottom plate and radiators are made of materials having good heat conducting characteristics.

Thermal energy generated by electronic components, such as GPU and memory, is transferred to the lower heat sink 36 via the plates 50 and 52. The air flow that is generated by the lower fan unit 29 and passes through the radiators 37 and 39 tends to remove the thermal energy as it propagates through the copper blocks 50 and 52 to the top of the radiators 37 and 39. The thermal energy remaining in the radiators 37 and 39 is transferred to the thermal transfer plate 30 that is soldered or brazed to the top of the radiators 37 and 39.

The fan carrier 35 includes the air intake slot 90 for the lower fan unit 29 and is mounted to the bottom of the middle insulating plate 28 by three screws 66 passed through openings 72, and threaded into threaded bores 67 tapped into the top of the carrier 35. The middle thermal transfer plate 30, preferably made of copper, is attached to the top edges of the radiators 37 and 39. As pointed out above, the copper plates 50 and 52 affixed to the bottom surface of the lower heat sink 36 engage the top of the GPU and memory to be mounted at 60 and 62, respectively, in order to transfer heat therefrom to the lower heat sink 36. As will be explained in more detail, any thermal energy remaining in the radiators 37 and 39 is conducted to the metal block of the upper heat dissipating assembly 13 via the thermal transfer plate 30.

The height of the thermal transfer block 56 is such as to substantially span the distance between the top of a corresponding active component mounted to board 12 and the bottom surface of the thermal transfer plate 30. Any gap remaining is closed by an appropriate thermally conductive compound. Likewise, any gap between the bottom surface of the metal plates 50 and 52 and the top of active electronic components is closed by an appropriate thermally conductive compound. The lower heat sink 36 is secured to the board 12 by a force fit of the upper ends of three risers 26b to openings 69 in the heat sink 36. The lower ends of the risers 26b are secured to the board 12 by means of appropriate mounting screws 68 or other suitable fasteners.

The middle insulating plate 32 prevents the air flow passed through the lower heat sink 36 from heating or being drawn by the upper fan unit 46 (FIG. 1). The plate 32 is secured to the board 12 by a force fit of the upper ends of three risers 26c to openings 80 in the plate 32. The lower ends of the risers 26c are secured to the board 12 by mounting screws 78 or other suitable fasteners. The middle insulating plate 28 is secured to the board 12 by the same way as the plate 32 using the three risers 26a and the screws 74. Alternatively, the lower heat sink 36 may be secured to the thermal transfer plate 30 by means of risers and screws.

As the GPU and memory of the recent graphics cards may generate thermal energy exceeding the maximum capacity of the lower heat dissipating subassembly 11 depicted in FIG. 2, an additional cooling mechanism may become necessary. FIG. 3 shows an exploded view of the additional cooling mechanism, referred to as upper heat dissipating subassembly 13 (FIG. 1), middle plates 28, 30 and 32, risers 38a-38c and the cover plate 40. The upper heat dissipating subassembly 13 includes: an upper heat sink or radiator 94 including a pipe 92; a metal block 96; a fan carrier 101 for carrying an upper fan unit 46 and vanes 117; a flow director 42; and a pump 102. The pump 102, such as a Ceramic pump, circulates coolant through the pipe 92 and a tubing 98 formed in the metal block 96. The thermal transfer plate 30 transfers any thermal energy remaining in the lower heat sink 36 to the metal block 96. The metal block 96, preferably made of copper, includes a hollow tubing or tortuous flow passage 98 for circulating coolant therethrough, and secured to the flow director 42 by four screws 126 passed through openings 100 on the flow director 42 and threaded into threaded bores tapped into the sides of the metal block 96.

The upper radiator 94, including baffles and the pipe 92 attached to the baffles, is secured to the flow director 42 by four screws 124 passed through the openings 125 in the flow director 42 and threaded through threaded bores (not shown in FIG. 4) tapped into sides of the upper radiator 94. The upper radiator 94 has a structure similar to the radiator 88, i.e., it has a bottom plate (not shown in FIG. 4) and baffles formed on the bottom plate. Alternatively, the upper radiator 94 may be molded onto the flow director 42. Further alternatively, the upper radiator 94 may include a portion of the pipe 92 and baffles only. The pipe 92 is connected to the outlet of the tubing 98 to form a closed passage of coolant circulated by a pump 102, and thereby the thermal energy in the metal block 96 is transferred to the radiator 94 via the coolant.

The upper fan carrier 101 includes a base or plate and molded onto the flow director 42 or attached to the flow director 42 by a suitable method, such as soldering. The flow director 42 having a generally curved, elongated rectangular strip shape is secured to the cover plate 40 by five screws 114 passed through openings 116 and threaded into threaded bores 118 tapped into the flow director 42. The flow director 42 and cover plate 40 form an enclosure providing an air passage therebetween so that the air flow generated by the upper fan unit 46 passes over the metal block 96 and through the upper radiator 94 dissipating heat in the metal block 96, pipe 92 and radiator 94 before it is discharged through the holes 21 in the end plate 18.

As the air flow removes thermal energy from the metal block 96 and upper radiator 94 as it passes through the air passage, the air temperature is highest at the downstream end of the passage, i.e., at near the edge of the upper radiator 94 in proximity to the holes 21 in the end plate 18. Thus, the efficacy of the upper heat dissipating subassembly 13 may be maximized by positioning the hottest portion of the pipe at the downstream end of the passage. As depicted in FIG. 3, the coolant exiting from the exit port of the pump 102 enters into the inlet end of the tubing 98 and removes thermal energy from the metal block 96. The temperature of the coolant reaches the highest point when the coolant exits from the outlet end of the tubing. Subsequently, the heated coolant is directed toward the downstream end of the air passage through the pipe 92 and cooled down as it passes through the upper radiator 94 and returns to the pump 102.

The insulating plate 28 is secured to the cover plate 40 by a force fit of the lower ends of three risers 38a to openings 108 in the insulating plate 28. The upper ends of the risers 38a are secured to the cover plate 40 by mounting screws 104 or other suitable fasteners. The other insulating plate 32 is secured to the cover plate 40 by the same way as the insulating plate 28 using three risers 38c fitted into the holes 80 in the insulating plate 32 and screws 105 passed through the holes 110 in the cover plate 40. The insulating plate 28 prevents the air flow passed through the upper radiator 94 from heating or being drawn by the lower fan unit 29 (FIG. 2).

In FIGS. 2 and 3, only two radiators 37 and 39 and one heat transfer block 56 are shown to transfer heat to the upper heat dissipating subassembly 13 via the thermal transfer plate 30. However, it should be apparent to those of ordinary skill that more or less radiators or heat transfer blocks may be used without departing from the essence of the present invention.

FIG. 4 is a side elevation of the graphics device assembly 10 taken along the direction 4-4 in FIG. 1, illustrating air flows through the lower and upper heat dissipating subassemblies 11 and 13. The upper fan 46 draws air through the opening 44 in the cover plate 40. The air flow 97 generated by the upper fan unit 46 passes through the air passage formed by the cover plate 40 and flow director 42 dissipating heat from the heat block 96 and upper radiator 94, and exits through the holes 21 in the end plate 18. The lower fan unit 29 (FIG. 2) draws air through the air intake slot 90, where the air flow 99 is directed through the lower heat sink 36 and discharged to open space around the electrical components 16 as well as the radiator 88.

Figure 5:
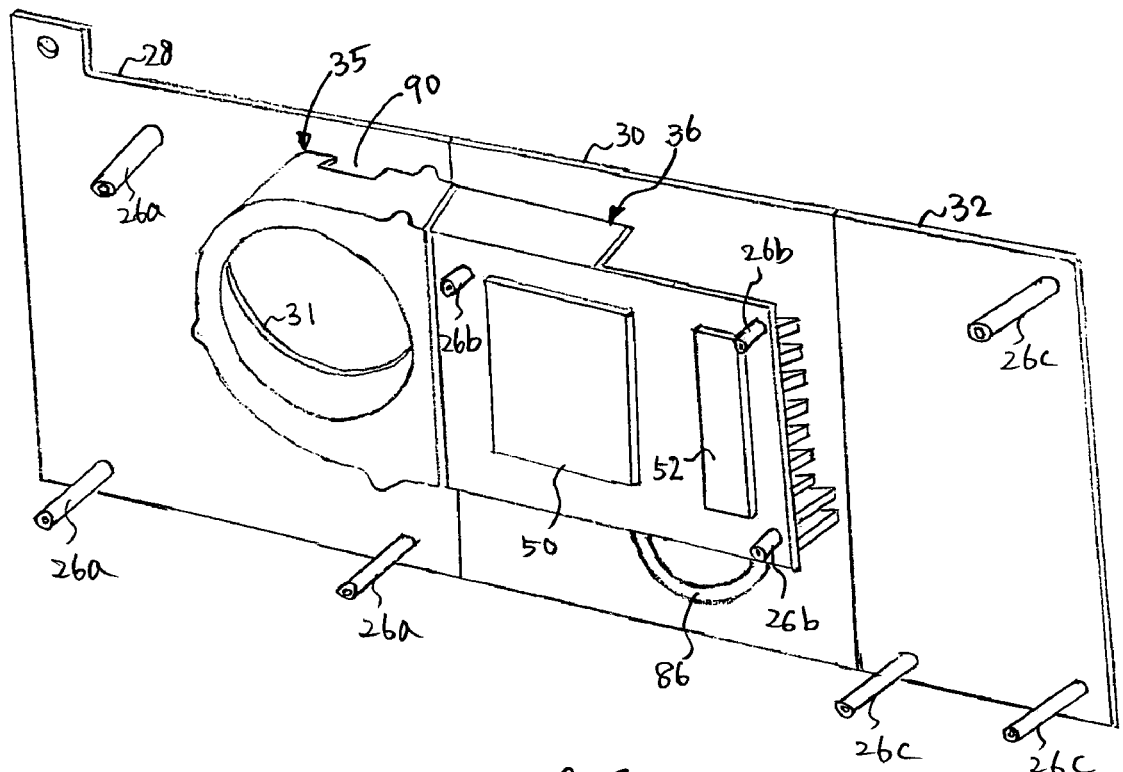
FIG. 5 is a perspective view showing the bottom of the middle plates, fan carrier and lower heat sink depicted in FIG. 2.

FIG. 5 is included to show the bottom side of the middle plates 28, 30 and 32, fan carrier 35, and lower heat sink 36 as well as standoff legs or risers 26a-26c. Note that the copper plates 50 and 52 in the preferred embodiment are molded onto the bottom of the lower heat sink 36. Alternatively, they could be soldered or brazed to the bottom of the lower heat sink 36.

As illustrated in FIG. 5, the fan carrier 35 and lower heat sink 36 are separated and respectively secured to the insulating plate 28 and board 12. Alternatively, the fan carrier 35 and lower heat sink 36 could be formed in one body and secured to either the insulating plate 28 or the board 12.

Figure 6:
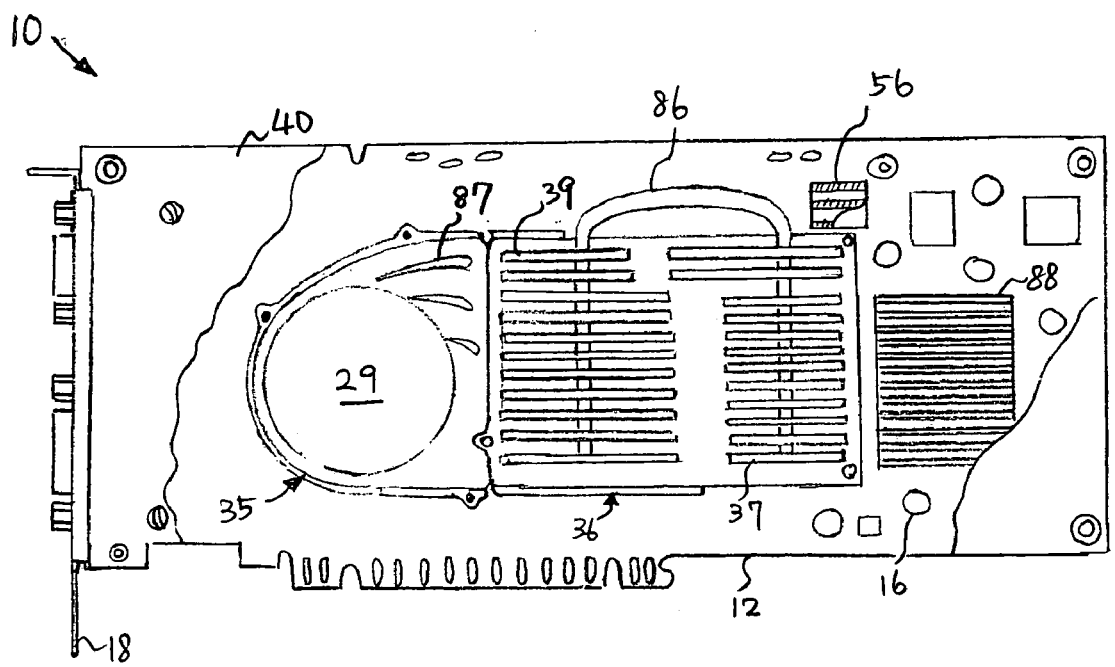
FIG. 6 is an assembly view shown in plan form with the cover plate, upper heat dissipating subassembly, middle plates and thermal transfer block partially broken away to reveal the internal detail of the lower heat dissipating subassembly.

In FIG. 6, an assembled card apparatus 10 is shown from the top with the cover plate 40 and middle plates 28, 30 and 32 partially broken away to reveal the lower fan carrier 35 having vanes 87, lower heat sink 36 and thermal transfer block 56. As pointed out above, thermal energy generated by GPU and memory (not shown in FIG. 6 but will be mounted to the board 12) is conducted into the bottom of the lower heat sink 36 and thence to the radiators 37 and 39 which in turn transfer heat to the plate 30 (FIG. 3). Air drawn through the air intake slot 90 by the lower fan unit 29 is directed through the radiators 37 and 39, drawing with it the heat transferred from the bottom plate of the lower heat sink 36, the radiators 37 and 39, and the bottom surface of the thermal transfer plate 30, and thence discharged to the space around the radiator 88, thermal transfer block 56 and other electronic components 16.

Alternatively, the lower fan 29 could be reversed to draw air in from the open sides of the lower heat dissipating subassembly 11 through the radiators 37 and 39 and to discharge the heated air through the slot 90. Flow in this direction would be preferable for some applications where the thermal energy generated by the thermal transfer block 56 and radiator 88 is substantially less than the thermal energy generated by the GPU and memory.

Figure 7:
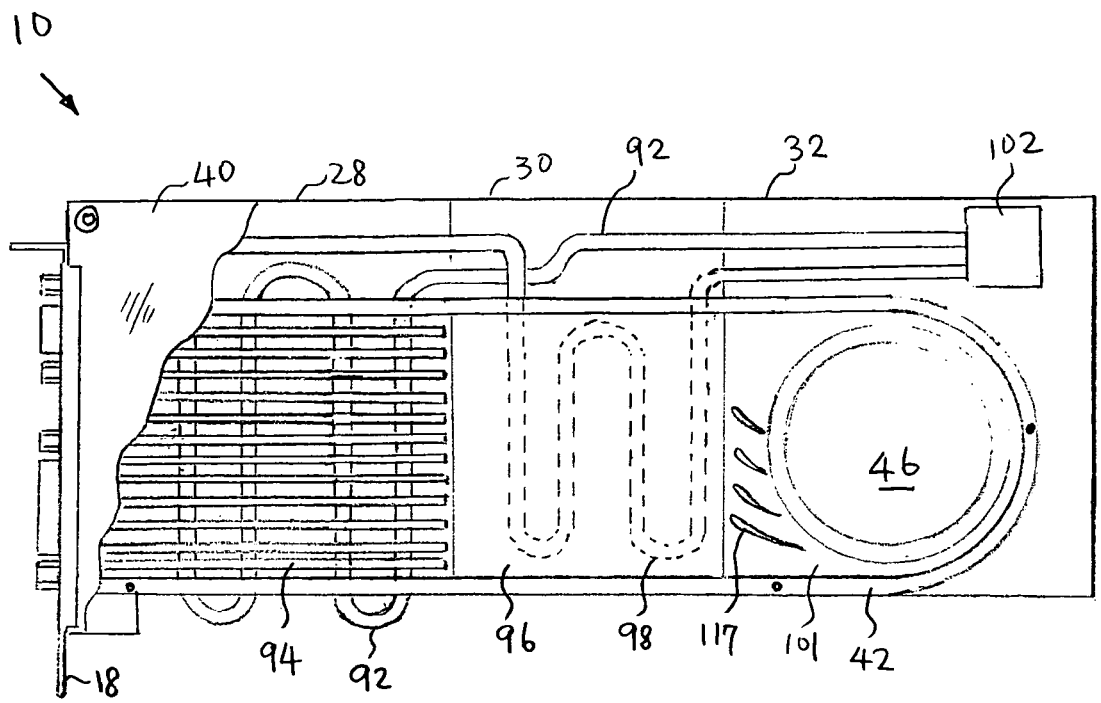
FIG. 7 is an assembly view shown in plan form with the cover plate broken away to reveal the internal detail of the upper heat dissipating subassembly.

In FIG. 7, an assembled card apparatus 10 is shown from the top with the cover plate 40 partially broken away to reveal the upper fan unit 46, vanes 117 formed on the carrier 101, upper radiator 94, metal block 96, cooling pipe 92, pump 102 and middle plates 28, 30 and 32. Air drawn by the upper fan unit 46 is directed through the air passage formed by the cover plate 40 and flow director 42; it passes over the metal block 96 and through the baffles of the upper radiator 94, drawing with it the heat transferred to the metal block 96, pipe 92 and upper radiator 94 before it is discharged through the holes 21 in the end plate 18 (FIG. 3). Suitable coolant is circulated through the pipe 92 and tubing 98 by the pump 102 so that the heat transferred to the metal block 96 is transferred to the upper radiator 94. Alternatively, the upper fan unit 46 could be reversed in some applications where the temperature of the upper radiator 94 is substantially lower than the temperature of the metal block 96. Further alternatively, an additional thermal transfer plate (similar to the plate 30) may be positioned between the upper radiator 94 and the cover plate 40 made of a heat conducting material, where the additional thermal transfer plate transfers heat from the upper radiator 94 to the cover plate 40.

Figure 8:
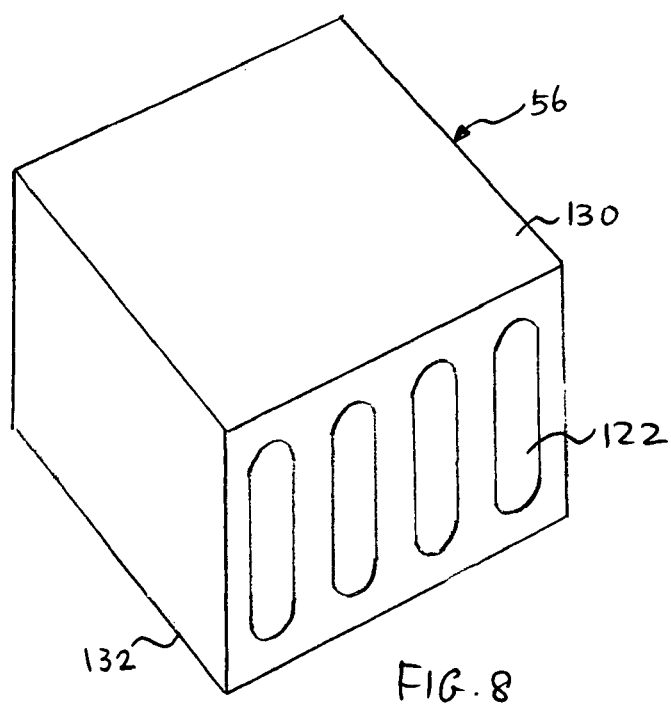
FIG. 8 is a perspective view of the thermal transfer block depicted in FIG. 2.

FIG. 8 is an exemplary form of a simple thermal transfer block that may be uses as the thermal transfer block 56 in FIG. 2. The block may be formed of, preferably, copper metal. However, any material having good thermal conductivity may be used. The illustrated block has four elongated openings 122 for receiving air flow induced by the lower fan unit 29 (FIG. 6). The bottom surface 132 is planar and intended to physically engage the top surface of an active electronic component mounted on the board 12 and transfer thermal energy therefrom. Similarly, the top surface 130 is planar and intended to engage the bottom surface of the thermal transfer plate 30 either directly or via an appropriate heat transferring compound deposited therebetween. Air flowing through the openings or passageways 122, as well as around the sides of the block, tends to remove thermal energy as it propagates through the block from bottom to top to be sunk to the thermal transfer plate 30.

Although the present invention has been described above in terms of particular embodiments illustrated in the several figures of the drawing, it will be appreciated that other configurations of fan carrier, flow directing vanes, thermal transfer blocks, heat sink ribs and cover plates may be utilized without deviating from the essence of the present invention. For example, ribs, vanes, or simple grooves or corrugations may be provided in the cover plate 40 in order to increase the surface area thereof. More details of the cover plate can be found in U.S. Pat. No. 6,671,177, entitled "Graphics card apparatus with improved heat dissipation," which is incorporated herein in its entirety. Also, more than one thermal transfer block may be used to transfer thermal energy from electronic components to the thermal transfer plate 30.

Notwithstanding that the present invention has been described above in terms of several alternative embodiments, it is anticipated that still other alterations and modifications will become apparent to those of ordinary skilled in the art after having read this disclosure. It is therefore intended that such disclosure be considered illustrative and not limiting, and that the appended claims be interpreted to include all such alterations, modifications and embodiments as fall within the true spirit and scope of the invention.

What is claimed:

1. A graphics card apparatus with improved heat dissipation, comprising:
    a metal block thermally coupled to one or more electronic components of said graphics card apparatus and including a tubing forming a tortuous passage for fluid therewithin, said tubing having an inlet end and an exit end;
    a radiator including a pipe having an inlet end and an exit end and baffles thermally coupled to said pipe, the inlet end of said pipe being connected to the exit end of said tubing;
    a pump having a first and second ports respectively connected to the inlet end of said tubing and the exit end of said pipe, said pump being operative to circulate coolant through said pipe and said tubing and thereby to transfer thermal energy from said metal block to said radiator;
    a first fan for generating an air flow and a first carrier for said first fan; and
    an enclosure surrounding said radiator, metal block, first fan and first carrier and forming an air passage from said first fan to said metal block and thence to said radiator, said enclosure including a generally planar cover plate and a flow director that consists of a generally curved, elongated rectangular strip and is positioned beneath said cover plate;
    whereby thermal energy generated by the electronic components is transferred to said metal block and thence to said radiator via said coolant and is ultimately removed from said radiator by an air flow drawn into said air passage.

2. A graphics card apparatus as recited in claim 1, wherein said cover plate having an aperture aligned with said first fan for fluid communication between said air passage and the atmosphere.

3. A graphics card apparatus as recited in claim 1, wherein said cover plate is made of heat conducting material and is operative to sink a portion of thermal energy generated by the electronic components.

4. A graphics card apparatus as recited in claim 1, wherein said first fan carrier includes a base portion having an opening for accommodating said first fan and caries a plurality of vanes that is formed on said base portion and is configured to direct an air flow generated by said first fan toward said air passage.

5. A graphics card apparatus as recited in claim 1, further including:
    a thermal transfer plate thermally coupled to said metal block;
    a heat sink having one or more radiators that are thermally coupled to said thermal transfer plate;
    one or more thermal transfer means for affixation to said electronic components and adapted to be thermally coupled to said heat sink; and
    a second fan for generating and directing an air flow toward said heat sink and a second fan carrier for carrying said second fan;
    whereby thermal energy generated by said electronic components is transferred to said heat sink and thermal transfer plate and is removed from said heat sink and thermal transfer plate by an air flow generated by said second fan.

6. A graphics card apparatus as recited in claim 5, further including one or more thermal transfer blocks of heat conductive material having a plurality of passageways extending therethrough for receiving an air flow generated by said second fan, each said thermal transfer block being adapted to transfer thermal energy from one of the electronic components to said thermal transfer plate.

7. A graphics card apparatus as recited in claim 6, wherein each said thermal transfer block includes a generally planar bottom surface for engaging the top surface of one of the electronic components and a top surface adapted to transfer thermal energy to said thermal transfer plate.

8. A graphics card apparatus as recited in claim 7, further comprising a thermally conductive compound disposed between said thermal transfer plate and said thermal transfer blocks.

9. A graphics card apparatus as recited in claim 5, further comprising a thermally conductive compound disposed between said thermal transfer plate and said metal block.

10. A graphics card apparatus as recited in claim 5, further including a first insulating plate that insulates heat transfer from said radiator to said second fan.

11. A graphics card apparatus as recited in claim 10, further including a second insulating plate that insulates heat transfer from an air flow exhausted through the baffles of said radiator to said second fan.

12. A graphics card apparatus as recited in claim 11, wherein said enclosure includes a generally planar cover plate and a flow director that is a generally bent, elongated rectangular strip and is positioned beneath said cover plate, further including a plurality of risers disposed proximate at least some of the corners of said first and second insulating plates and adapted to secure said first and second insulating plates in spaced apart relationship to said cover plate.

13. In a graphics card assembly including a printed circuit board with a plurality of heat generating components affixed thereto, and a heat dissipating mechanism also affixed to said printed circuit board for removing thermal energy from the heat generating components, an improved heat dissipating mechanism comprising:
   a metal block thermally coupled to said components and including a tubing forming a tortuous passage for fluid therewithin, said tubing having an inlet end and an exit end;
   a radiator including a pipe having an inlet end and an exit end and baffles thermally coupled to said pipe, the inlet end of said pipe being connected to the exit end of said tubing;
   a pump having a first and second ports respectively connected to the inlet end of said tubing and the exit end of said pipe, said pump being operative to circulate coolant through said pipe and said tubing and thereby to transfer thermal energy from said metal block to said radiator;
   a first fan for generating an air flow and a first carrier for said first fan; and
   an enclosure surrounding said radiator, metal block, first fan and first carrier and forming an air passage from said first fan to said metal block and thence to said radiator, said enclosure including a generally planar cover plate and a flow director that consists of a generally curved, elongated rectangular strip and is positioned beneath said cover plate;
   whereby thermal energy generated by the components is transferred to said metal block and thence to said radiator via said coolant and ultimately removed from said radiator by an air flow drawn into said air passage.

14. In a graphics card assembly as recited in claim 13, wherein said cover plate having an aperture aligned with said first fan for fluid communication between said air passage and the atmosphere.

15. In a graphics card assembly as recited in claim 13, wherein said first fan carrier includes a base portion having an opening for accommodating said first fan and carries a plurality of vanes that is formed on said base portion and is configured to direct an air flow generated by said first fan toward said air passage.

16. In a graphics card assembly as recited in claim 13, further comprising:
   a thermal transfer plate thermally coupled to said metal block;
   a heat sink having one or more radiators that are thermally coupled to said thermal transfer plate;
   one or more thermal transfer means for affixation to said electronic components and adapted to be thermally coupled to said heat sink; and
   a second fan for generating and directing an air flow toward said heat sink and a second fan carrier for carrying said second fan;
   whereby thermal energy generated by said electronic components is transferred to said heat sink and thermal transfer plate and is removed from said heat sink and thermal transfer plate by an air flow generated by said second fan.

17. In a graphics card assembly as recited in claim 16, further including one or more thermal transfer blocks of heat conductive material having a plurality of passageways extending therethrough for receiving an air flow generated by said second fan, each said thermal transfer block being adapted to transfer thermal energy from one of the electronic components to said thermal transfer plate.

18. In a graphics card assembly as recited in claim 17, wherein each said thermal transfer block includes a generally planar bottom surface for engaging the top surface of one of the electronic components and a top surface adapted to transfer thermal energy to said thermal transfer plate.

* * * * *